(12) United States Patent
Filipiak et al.

(10) Patent No.: US 9,455,029 B2
(45) Date of Patent: Sep. 27, 2016

(54) THRESHOLD VOLTAGE ANALYSIS

(71) Applicant: MICRON TECHNOLOGY, INC., Boise, ID (US)

(72) Inventors: William C. Filipiak, Boise, ID (US); Violante Moschiano, Avezzano (IT)

(73) Assignee: Micron Technology, Inc., Boise, ID (US)

(*) Notice: Subject to any disclaimer, the term of this patent is extended or adjusted under 35 U.S.C. 154(b) by 193 days.

(21) Appl. No.: 14/285,848

(22) Filed: May 23, 2014

(65) Prior Publication Data
US 2015/0340086 A1    Nov. 26, 2015

(51) Int. Cl.
| G11C 16/04 | (2006.01) |
| G11C 11/56 | (2006.01) |
| G11C 29/50 | (2006.01) |
| G11C 29/42 | (2006.01) |

(52) U.S. Cl.
CPC .......... *G11C 11/5642* (2013.01); *G11C 29/42* (2013.01); *G11C 29/50004* (2013.01); *G11C 16/0483* (2013.01)

(58) Field of Classification Search
CPC .. G11C 11/5642; G01R 31/26; G01R 19/165
See application file for complete search history.

(56) References Cited

U.S. PATENT DOCUMENTS

| 3,940,479 A | 2/1976 | Shomura et al. |
| 4,617,479 A | 10/1986 | Hartmann et al. |
| 5,406,147 A | 4/1995 | Coyle et al. |
| 5,712,825 A | 1/1998 | Hadderman et al. |
| 6,038,166 A * | 3/2000 | Wong ........................ 365/185.03 |
| 7,031,210 B2 | 4/2006 | Park et al. |
| 7,920,428 B2 | 4/2011 | Yamada |
| 8,073,648 B2 | 12/2011 | Shlick et al. |
| 2013/0070524 A1* | 3/2013 | Dutta et al. .............. 365/185.03 |
| 2015/0255166 A1* | 9/2015 | Tseng et al. ............. 365/185.03 |

OTHER PUBLICATIONS

International Search Report and Written Opinion from related international application No. PCT/US2015/031477, dated Aug. 11, 2015, 10 pp.
Cai, Yu, et al, "Threshold Voltage Distribution in MLC and NAND Flash Memory: Characterization, Analysis, and Modeling" Research Paper (2013) 6 pgs., Allentown, PA.

* cited by examiner

*Primary Examiner* — Richard Elms
*Assistant Examiner* — Mohammed A Bashar
(74) *Attorney, Agent, or Firm* — Brooks, Cameron & Huebsch, PLLC

(57) ABSTRACT

Apparatuses and methods for threshold voltage analysis are described. One or more methods for threshold voltage analysis include storing expected state indicators corresponding to a group of memory cells, applying a first sensing voltage to a selected access line to which the group of memory cells is coupled, sensing whether at least one of the memory cells of the group conducts responsive to the first sensing voltage, determining whether a discharge indicator for the at least one of the memory cells has changed responsive to application of the first sensing voltage, and determining that the first sensing voltage is the threshold voltage for a particular program state of the at least one of the memory cells.

39 Claims, 7 Drawing Sheets

| BLOCK | PAGE | DAC | L0 | L1 | L2 | L3 |
|---|---|---|---|---|---|---|
| 456 | 255 | 0 | 17747 | 0 | 0 | 0 |
| 456 | 255 | 1 | 174 | 0 | 0 | 0 |
| 456 | 255 | 2 | 109 | 0 | 0 | 0 |
| 456 | 255 | 3 | 71 | 0 | 0 | 0 |
| 456 | 255 | 4 | 40 | 0 | 0 | 0 |
| 456 | 255 | 5 | 47 | 0 | 0 | 0 |
| 456 | 255 | 6 | 28 | 0 | 0 | 0 |
| 456 | 255 | 7 | 19 | 0 | 0 | 0 |
| 456 | 255 | 8 | 22 | 0 | 0 | 0 |
| 456 | 255 | 9 | 13 | 0 | 0 | 0 |
| 456 | 255 | 10 | 13 | 0 | 0 | 0 |
| 456 | 255 | 11 | 6 | 0 | 0 | 0 |
| 456 | 255 | 12 | 10 | 0 | 0 | 0 |
| 456 | 255 | 13 | 4 | 0 | 0 | 0 |
| 456 | 255 | 14 | 5 | 0 | 0 | 0 |
| 456 | 255 | 15 | 3 | 0 | 0 | 0 |
| 456 | 255 | 16 | 2 | 0 | 0 | 0 |
| 456 | 255 | 17 | 3 | 0 | 0 | 0 |
| 456 | 255 | 18 | 1 | 0 | 0 | 0 |
| 456 | 255 | 19 | 1 | 0 | 0 | 0 |
| 456 | 255 | 20 | 1 | 0 | 0 | 0 |
| 456 | 255 | 21 | 0 | 0 | 0 | 0 |
| 456 | 255 | 22 | 3 | 0 | 0 | 0 |
| 456 | 255 | 23 | 0 | 0 | 0 | 0 |
| 456 | 255 | 24 | 1 | 0 | 0 | 0 |
| 456 | 255 | 25 | 0 | 0 | 0 | 0 |
| 456 | 255 | 26 | 0 | 0 | 0 | 0 |
| 456 | 255 | 27 | 2 | 0 | 0 | 0 |
| 456 | 255 | 28 | 0 | 0 | 0 | 0 |
| 456 | 255 | 29 | 0 | 0 | 0 | 0 |
| 456 | 255 | 30 | 0 | 0 | 0 | 0 |
| 456 | 255 | 31 | 0 | 1 | 0 | 0 |
| 456 | 255 | 32 | 0 | 0 | 0 | 0 |
| 456 | 255 | 33 | 0 | 0 | 0 | 0 |
| 456 | 255 | 34 | 0 | 3 | 0 | 0 |
| 456 | 255 | 35 | 0 | 2 | 0 | 0 |
| 456 | 255 | 36 | 0 | 4 | 0 | 0 |
| 456 | 255 | 37 | 0 | 9 | 0 | 0 |
| 456 | 255 | 38 | 0 | 15 | 0 | 0 |
| 456 | 255 | 39 | 0 | 24 | 1 | 0 |
| 456 | 255 | 40 | 0 | 48 | 0 | 1 |
| 456 | 255 | 41 | 0 | 146 | 0 | 1 |
| 456 | 255 | 42 | 0 | 264 | 0 | 0 |
| 456 | 255 | 43 | 0 | 516 | 0 | 1 |
| 456 | 255 | 44 | 0 | 1043 | 1 | 0 |
| 456 | 255 | 45 | 0 | 1627 | 0 | 0 |
| 456 | 255 | 46 | 0 | 1894 | 0 | 0 |
| 456 | 255 | 47 | 0 | 2756 | 1 | 0 |
| 456 | 255 | 48 | 0 | 2301 | 0 | 0 |
| 456 | 255 | 49 | 0 | 2389 | 1 | 0 |

| | | | | | | |
|---|---|---|---|---|---|---|
| 456 | 255 | 50 | 0 | 2042 | 0 | 0 |
| 456 | 255 | 51 | 0 | 1507 | 0 | 0 |
| 456 | 255 | 52 | 0 | 873 | 1 | 0 |
| 456 | 255 | 53 | 0 | 639 | 0 | 0 |
| 456 | 255 | 54 | 0 | 334 | 0 | 0 |
| 456 | 255 | 55 | 0 | 139 | 0 | 0 |
| 456 | 255 | 56 | 0 | 80 | 0 | 0 |
| 456 | 255 | 57 | 0 | 42 | 0 | 0 |
| 456 | 255 | 58 | 0 | 17 | 0 | 0 |
| 456 | 255 | 59 | 0 | 5 | 0 | 0 |
| 456 | 255 | 60 | 0 | 2 | 0 | 0 |
| 456 | 255 | 61 | 0 | 0 | 0 | 0 |
| 456 | 255 | 62 | 0 | 0 | 0 | 0 |
| 456 | 255 | 63 | 0 | 1 | 0 | 0 |
| 456 | 255 | 64 | 0 | 0 | 0 | 0 |
| 456 | 255 | 65 | 0 | 0 | 1 | 0 |
| 456 | 255 | 66 | 0 | 0 | 2 | 0 |
| 456 | 255 | 67 | 0 | 0 | 5 | 0 |
| 456 | 255 | 68 | 0 | 0 | 2 | 0 |
| 456 | 255 | 69 | 0 | 0 | 10 | 0 |
| 456 | 255 | 70 | 0 | 0 | 15 | 0 |
| 456 | 255 | 71 | 0 | 0 | 25 | 0 |
| 456 | 255 | 72 | 0 | 0 | 60 | 0 |
| 456 | 255 | 73 | 0 | 0 | 153 | 0 |
| 456 | 255 | 74 | 0 | 0 | 349 | 0 |
| 456 | 255 | 75 | 0 | 0 | 737 | 0 |
| 456 | 255 | 76 | 0 | 0 | 1558 | 0 |
| 456 | 255 | 77 | 0 | 0 | 2291 | 0 |
| 456 | 255 | 78 | 0 | 0 | 2693 | 0 |
| 456 | 255 | 79 | 0 | 0 | 3209 | 0 |
| 456 | 255 | 80 | 0 | 0 | 2510 | 0 |
| 456 | 255 | 81 | 0 | 0 | 2014 | 0 |
| 456 | 255 | 82 | 0 | 0 | 1522 | 0 |
| 456 | 255 | 83 | 0 | 0 | 862 | 0 |
| 456 | 255 | 84 | 0 | 0 | 437 | 0 |
| 456 | 255 | 85 | 0 | 0 | 257 | 0 |
| 456 | 255 | 86 | 0 | 0 | 133 | 0 |
| 456 | 255 | 87 | 0 | 0 | 35 | 0 |
| 456 | 255 | 88 | 0 | 0 | 19 | 0 |
| 456 | 255 | 89 | 0 | 0 | 5 | 0 |
| 456 | 255 | 90 | 0 | 0 | 5 | 0 |
| 456 | 255 | 91 | 0 | 0 | 0 | 0 |
| 456 | 255 | 92 | 0 | 0 | 1 | 2 |
| 456 | 255 | 93 | 0 | 0 | 0 | 5 |
| 456 | 255 | 94 | 0 | 0 | 0 | 4 |
| 456 | 255 | 95 | 0 | 0 | 0 | 7 |
| 456 | 255 | 96 | 0 | 0 | 0 | 16 |
| 456 | 255 | 97 | 0 | 0 | 0 | 33 |
| 456 | 255 | 98 | 0 | 0 | 0 | 55 |
| 456 | 255 | 99 | 0 | 0 | 0 | 144 |

| | | | | | | |
|---|---|---|---|---|---|---|
| 456 | 255 | 100 | 0 | 0 | 0 | 214 |
| 456 | 255 | 101 | 0 | 0 | 0 | 510 |
| 456 | 255 | 102 | 0 | 0 | 0 | 965 |
| 456 | 255 | 103 | 0 | 0 | 0 | 1352 |
| 456 | 255 | 104 | 0 | 0 | 0 | 1715 |
| 456 | 255 | 105 | 0 | 0 | 0 | 2639 |
| 456 | 255 | 106 | 0 | 0 | 0 | 2328 |
| 456 | 255 | 107 | 0 | 0 | 0 | 2206 |
| 456 | 255 | 108 | 0 | 0 | 0 | 2020 |
| 456 | 255 | 109 | 0 | 0 | 0 | 1479 |
| 456 | 255 | 110 | 0 | 0 | 0 | 954 |
| 456 | 255 | 111 | 0 | 0 | 0 | 813 |
| 456 | 255 | 112 | 0 | 0 | 0 | 430 |
| 456 | 255 | 113 | 0 | 0 | 0 | 234 |
| 456 | 255 | 114 | 0 | 0 | 0 | 139 |
| 456 | 255 | 115 | 0 | 0 | 0 | 76 |
| 456 | 255 | 116 | 0 | 0 | 0 | 30 |
| 456 | 255 | 117 | 0 | 0 | 0 | 21 |
| 456 | 255 | 118 | 0 | 0 | 0 | 6 |
| 456 | 255 | 119 | 0 | 0 | 0 | 4 |
| 456 | 255 | 120 | 0 | 0 | 0 | 0 |
| 456 | 255 | 121 | 0 | 0 | 0 | 0 |
| 456 | 255 | 122 | 0 | 0 | 0 | 1 |
| 456 | 255 | 123 | 0 | 0 | 0 | 0 |
| 456 | 255 | 124 | 0 | 0 | 0 | 0 |

*Fig. 5C*

THRESHOLD VOLTAGE ANALYSIS

TECHNICAL FIELD

The present disclosure relates generally to semiconductor memory devices and methods and, more particularly, to apparatuses and methods for threshold voltage (Vt) analysis.

BACKGROUND

Memory devices are typically provided as internal, semiconductor, integrated circuits and/or external removable devices in computers or other electronic devices. There are many different types of memory including random-access memory (RAM), read only memory (ROM), dynamic random access memory (DRAM), synchronous dynamic random access memory (SDRAM), phase change random access memory (PCRAM), and/or flash memory, among others.

Flash memory devices can be utilized as non-volatile memory for a wide range of electronic applications. Flash memory devices typically use a one-transistor memory cell that allows for high memory densities, high reliability, and/or low power consumption. Uses for flash memory include memory for solid state drives (SSDs), personal computers, personal digital assistants (PDAs), digital cameras, cellular telephones, portable music players, e.g., MP3 players, and/or movie players, among other electronic devices.

Two common types of flash memory array architectures are the "NAND" and "NOR" architectures, so called for the logical form in which the basic memory cell configuration of each is arranged. A NAND array architecture arranges its array of memory cells in a matrix such that the control gates of each memory cell in a "row" of the array are coupled to, and in some cases from, an access line, which is commonly referred to in the art as a "word line". However each memory cell is not directly coupled to a sense line (which is commonly referred to as a "data line" or a "bit line" in the art) by its drain. Instead, the memory cells of the array are coupled together in series, source to drain, between a common source and a sense line, where the memory cells commonly coupled to a particular sense line are commonly referred to as a "column" or a "string" in the art.

Memory cells in a NAND array architecture can be programmed to a targeted, e.g., desired, program state. For example, electric charge can be placed on or removed from a charge storage structure, e.g., a floating gate or charge trap, of a memory cell to put the memory cell into one of a number of program states. For example, a single level cell (SLC) can be programmed to one of two program states, e.g., one bit, so as to represent a binary data value, e.g., "1" or "0", stored by the memory cell.

Some NAND memory cells can be programmed to a targeted one of more than two program states. Such memory cells may be referred to as multi state memory cells, multiunit cells, or multilevel cells (MLCs). MLCs can provide higher density memories without increasing the number of memory cells since each memory cell can represent more than one bit. A MLC using four program states (e.g., 11, 01, 00, and 10) can use four charge amounts in a floating gate so that the state can be represented by one of four voltage levels such that the MLC can store two bits of data. Generally, N bits per memory cell can be represented using $2^N$ voltage levels. Newer devices may be expected to use eight or more voltage levels. Using a high number of bits per memory cell allows the production of flash devices with high data density and thus reduces the overall cost per flash device. The read operation of a SLC uses one Vt level that is between the "0" and "1" voltage levels, e.g., program states. However, the read operation of a MLC with four states uses three Vt levels, an MLC with eight states uses seven Vt levels, and a memory cell that stores N bits per memory cell, represented by $2^N$ states, uses $2^{N-1}$ Vt levels for read operations.

A NAND array architecture that includes a large number of memory cells with multiple bits per memory cell can be expected to have a range of actual Vt levels for each program state based upon statistical variation. The range of actual Vt levels for each program state may result from random variation in manufacturing and/or programming of the memory cells, in erasing a memory cell prior to being reprogrammed, which can inherently broaden a voltage level range stored by each memory cell for each program state, among other causes. With continued increase in complexity, miniaturization, etc., of NAND technology, along with the number of bits programmed per memory cell, the reliability and/or endurance of NAND memory cells may be decreasing, at least partially by variability in the actual Vts for the program states relative to preprogrammed reference, e.g., sense and/or read, voltages.

BRIEF DESCRIPTION OF THE DRAWINGS

FIGS. 5A-5C illustrate data stored in memory representative of memory cell discharge at a range of sensing voltages in accordance with one or more embodiments of the present disclosure.

DETAILED DESCRIPTION

Figure 1:
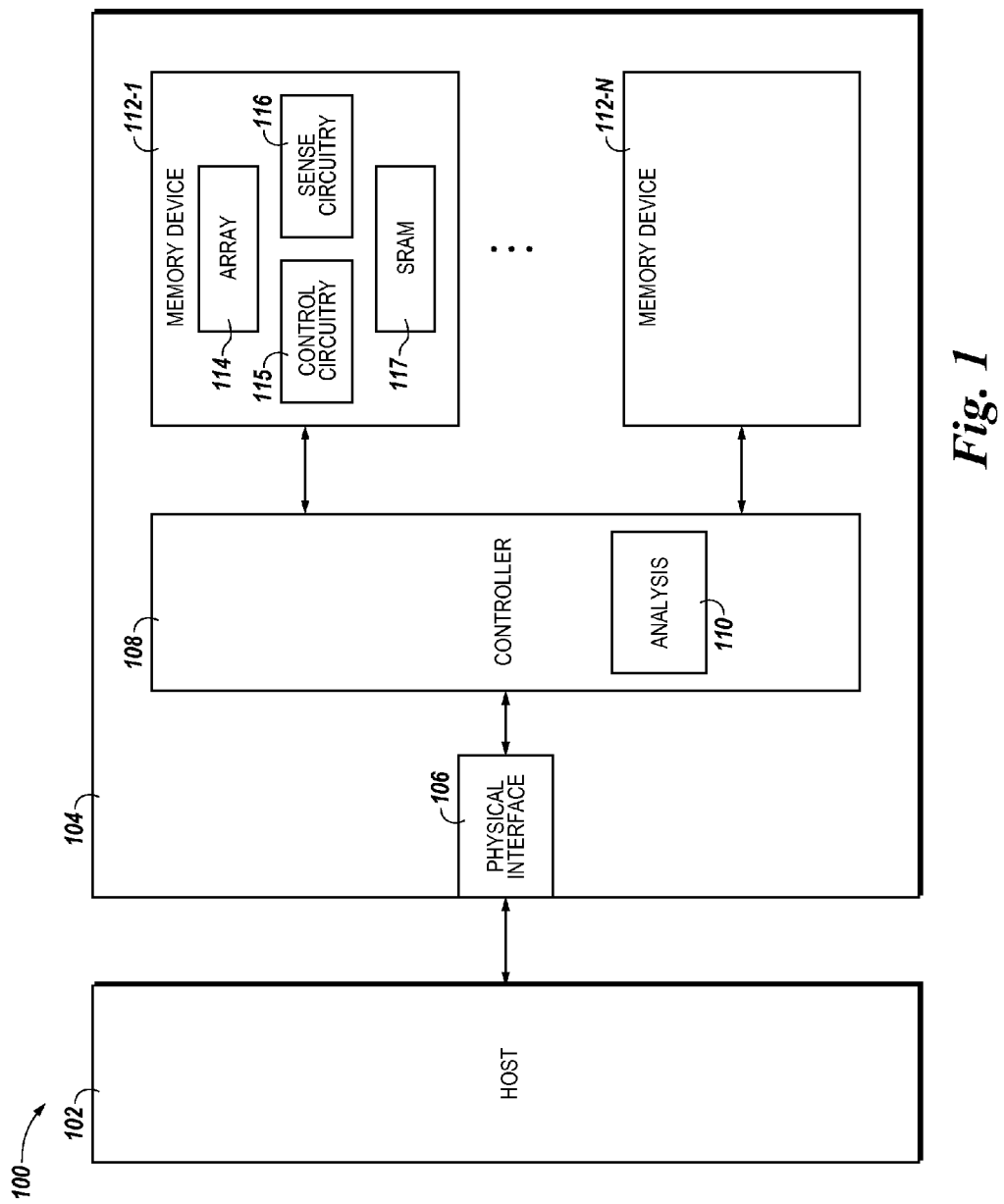
FIG. 1 is a functional block diagram of an apparatus in the form of a computing system including at least one memory system in accordance with one or more embodiments of the present disclosure.

The present disclosure includes apparatuses and methods for Vt analysis, e.g., collection, determination, correction, etc., of Vts for memory cells. One or more apparatuses for Vt analysis include an array of memory cells, control circuitry configured to apply a range, e.g., series, of stored sensing voltages to a selected access line, e.g., word line, coupled to the array of memory cells, e.g., applied subsequent to storage of the range of stored sensing voltages. The one or more apparatuses include sense circuitry configured to sense a discharge of each of a number of memory cells, when each begins to conduct, potentially resulting from application of each voltage in the range of stored sensing voltages, where the apparatus is configured to store a discharge indicator for each of a number of memory cells that indicates a lower voltage, e.g., a lowermost voltage when each begins to conduct, in the range of stored sensing voltages.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure.

As used herein, the designators "N" and "M," particularly with respect to reference numerals in the drawings, indicate that a number of the particular feature so designated can be included with one or more embodiments of the present disclosure. Additionally, as used herein, "a number of" something can refer to one or more such things. For example, a number of memory devices can refer to one or more memory devices.

The figures herein follow a numbering convention in which the first digit corresponds to the drawing figure number and the remaining digits identify an element or component in the drawing. Similar elements or components between different figures may be identified by the use of similar digits. For example, 111 may reference element "11" in FIG. 1, and a similar element may be referenced as 211 in FIG. 2. As will be appreciated, elements shown in the various embodiments herein can be added, exchanged, and/or eliminated so as to provide a number of additional embodiments of the present disclosure. In addition, as will be appreciated, the proportion and/or the relative scale of the elements provided in the figures are intended to illustrate the embodiments of the present invention and should not be taken in a limiting sense.

FIG. 1 is a functional block diagram of an apparatus in the form of a computing system 100 including at least one memory system 104 in accordance with one or more embodiments of the present disclosure. Memory system 104 can be, for example, a solid state drive (SSD). In the embodiment illustrated in FIG. 1, memory system 104 includes a physical host interface 106, a number of memory devices 112-1, . . . , 112-N (e.g., solid state memory devices), and a controller 108 (e.g., an SSD controller) coupled to physical host interface 106 and memory devices 112-1, . . . , 112-N.

Physical host interface 106 can be used to communicate information between memory system 104 and another device, such as a host 102. Host 102 can include a memory access device (e.g., a processor). One of ordinary skill in the art will appreciate that "a processor" can be a number of processors, such as a parallel processing system, a number of coprocessors, etc. Example hosts can include laptop computers, personal computers, digital cameras, digital recording and playback devices, mobile telephones, PDAs, memory card readers, interface hubs, and the like.

Physical host interface 106 can be in the form of a standardized physical interface. For example, when memory system 104 is used for information storage in computing system 100, physical host interface 106 can be a serial advanced technology attachment (SATA) physical interface, a peripheral component interconnect express (PCIe) physical interface, or a universal serial bus (USB) physical interface, among other physical connectors and/or interfaces. In general, however, physical host interface 106 can provide an interface for passing control, address, information (e.g., data), and/or other signals between memory system 104 and a host (e.g., host 102) having compatible receptors for physical host interface 106.

Controller 108 can include, for example, control circuitry and/or firmware. Controller 108 can be operably coupled to or included on the same physical device (e.g., a die) as one or more of the memory devices 112-1, . . . , 112-N. For example, controller 108 can be an application specific integrated circuit (ASIC) operably coupled to a printed circuit board including physical host interface 106 and memory devices 112-1, . . . , 112-N. Alternatively, controller 108 can be included on a separate physical device that is communicatively coupled to the physical device (e.g., the die) that includes one or more of the memory devices 112-1, . . . , 112-N.

Controller 108 can communicate with memory devices 112-1, . . . , 112-N to direct operations to sense (e.g., read), program (e.g., write), and/or erase information, among other operations. Controller 108 can have circuitry that may be a number of integrated circuits and/or discrete components. In a number of embodiments, the circuitry in controller 108 may include control circuitry for controlling access across memory devices 112-1, . . . , 112-N and/or circuitry for providing a translation layer between host 102 and memory system 104. The controller 108 can include analysis 110 circuitry and/or programming for analysis and/or implementation of, for instance, the collection, determination, correction, etc., of Vts for memory cells, and/or to determine a program state of memory cells, as described herein. In one or more embodiments, such analysis can be performed as a result of input through the host 102 provided by a manufacturer- and/or seller-associated tester and/or an in-service tester, e.g., provided by an automated testing program and/or by a human operator, among other possibilities.

Memory devices 112-1, . . . , 112-N can include, for example, a number of non-volatile memory arrays 114, e.g., arrays of non-volatile memory cells. For instance, memory devices 112-1, . . . , 112-N can include arrays of memory cells, such as array 220 described in FIG. 2, which can be operated in accordance with embodiments described herein. As will be appreciated, the memory cells in the memory arrays 114 of memory devices 112-1, . . . , 112-N can be in a NAND architecture, a NOR architecture, or some other memory array architecture.

As described herein, one or more memory devices 112-1, . . . , 112-N can be formed on the same die. A particular memory device, e.g., memory device 112-1, can include one or more arrays of memory cells 114 formed on the die. In one or more embodiments, as described further herein, the same die can include control circuitry 115, sense circuitry 116, and/or memory 117 to store instructions for, and/or to store results (e.g., data) obtained from, operation of the control circuitry 115 and/or the sense circuitry 116. For example, the memory 117 can be static random access memory (SRAM), which can have a number of advantages in comparison to dynamic RAM (DRAM). Such advantages for SRAM relative to DRAM can, for instance, include providing faster access times, not pausing between accesses to provide shorter cycle times, and/or not having a refresh requirement for the memory.

The memory arrays 114 of memory devices 112-1, . . . , 112-N can include a number of memory cells that can be grouped. As used herein, a group can include a number of memory cells, such as those formed on or in a die, a number of entire arrays, a page, a block, a plane, and/or other groups of memory cells. For example, some memory arrays can include a number of pages of memory cells that make up a block of memory cells. A number of blocks can be included in a plane of memory cells. A number of planes of memory cells can be included on a die. As an example, a 128 GB memory device can include 4320 bytes of information per page, 256 pages per block, 2048 blocks per plane, and 16 planes per memory device.

The embodiment illustrated in FIG. 1 can include additional circuitry that is not illustrated so as not to obscure embodiments of the present disclosure. For example, memory devices 112-1, . . . , 112-N can include address circuitry to latch address signals provided over I/O connectors through I/O circuitry. Address signals can be received and decoded by a row decoder and a column decoder, to access memory array 114. It will be appreciated that the number of address input connectors can depend on the density and/or architecture of memory devices 112-1, . . . , 112-N and/or memory arrays 114.

Figure 2:
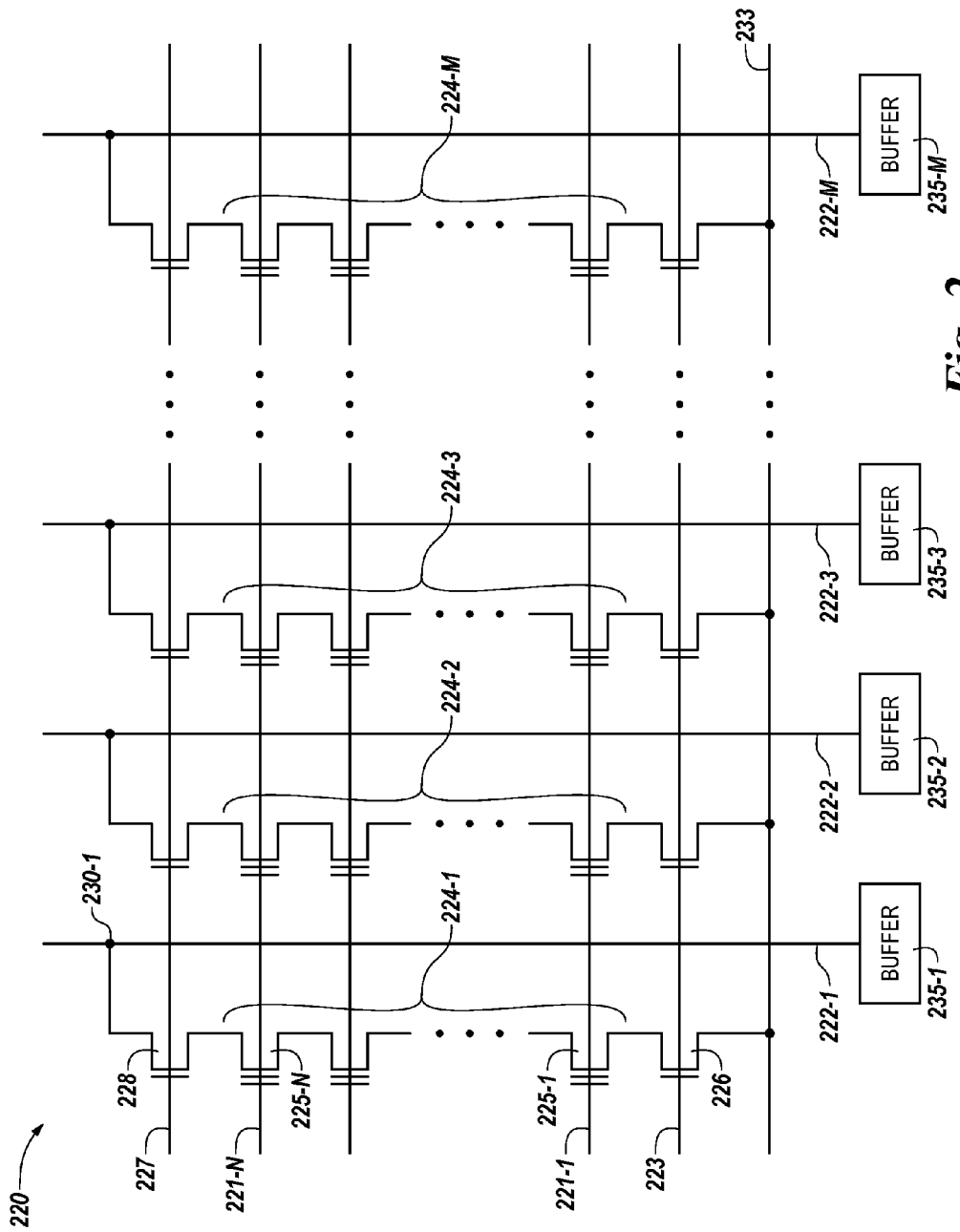
FIG. 2 is a schematic of a portion of an apparatus in the form of a non-volatile memory array in accordance with one or more embodiments of the present disclosure.

FIG. 2 is a schematic of a portion of an apparatus in the form of a non-volatile memory array 220 in accordance with one or more embodiments of the present disclosure. The embodiment of FIG. 2 illustrates a NAND architecture non-volatile memory array. However, embodiments described herein are not limited to this example. As shown in FIG. 2, the non-volatile memory array 220 includes access lines, e.g., word lines 221-1, . . . , 221-N, and intersecting sense lines, e.g., local bit lines 222-1, . . . , 222-M. For ease of addressing in the digital environment, the number of word lines 221-1, . . . , 221-N and the number of local bit lines 222-1, . . . , 222-M can be some power of two, e.g., 256 word lines by 4,096 bit lines.

Memory array 220 includes NAND strings 224-1, . . . , 224-M. Each NAND string includes non-volatile memory cells 225-1, . . . , 225-N, each communicatively coupled to a respective access line, e.g., selected from word lines 221-1, . . . , 221-N. Each NAND string, and its constituent memory cells, is also associated with a respective sense line, e.g., selected from local bit lines 222-1, . . . , 222-M. The memory cells 225-1, . . . , 225-N of each NAND string 224-1, . . . , 224-M are connected in series source to drain between a source select gate (SGS), e.g., a field-effect transistor (FET) 226, and a drain select gate (SGD), e.g., FET 228. Each source select gate 226 is configured to selectively couple a respective NAND string to a common source 233 responsive to a signal on source select line 223, while each drain select gate 228 is configured to selectively couple a respective NAND string to a respective bit line responsive to a signal on drain select line 227.

As shown in the embodiment illustrated in FIG. 2, a source of source select gate 226 is connected to a common source line 233. The drain of source select gate 226 is connected to the source of the memory cell 225-1 of the corresponding NAND string 224-1. The drain of drain select gate 228 is connected to bit line 222-1 of the corresponding NAND string 224-1 at drain contact 230-1. The source of drain select gate 228 is connected to the drain of the last memory cell 225-N, e.g., a floating-gate transistor, of the corresponding NAND string 224-1.

In one or more embodiments, construction of the non-volatile memory cells 225-1, . . . , 225-N includes a source, a drain, a floating gate or other charge storage structure, and a control gate. The memory cells 225-1, . . . , 225-N have their control gates coupled to a word line, 221-1, . . . , 221-N, respectively. A NOR array architecture would be similarly laid out, except that the string of memory cells would be coupled in parallel between the select gates.

Subsets of memory cells, e.g., selected from those including 225-1, . . . , 225-N, coupled to a selected word line, selected from 221-1, . . . , 221-N, respectively, can be programmed and/or sensed, e.g., read, together as a group. A number of memory cells programmed and/or sensed together can correspond to a page of data. A programming operation, e.g., a write operation, can include applying a number of program pulses, e.g., 16V-20V, to a selected word line in order to increase the Vt of selected memory cells coupled to that selected word line to a desired program voltage level corresponding to a targeted program state.

A sensing operation, such as a read and/or a Vt analysis operation, e.g., using a soft data strobe, as described herein, can include sensing a voltage and/or current change, e.g., discharge, on a sense line, e.g., a bit line, coupled to a selected memory cell in order to determine the program state and/or the Vt of the selected memory cell. The sensing operation can include precharging a bit line and sensing the discharge when a selected memory cell begins to conduct.

Sensing to determine the program state and/or the Vt of the selected memory cell can include providing a number of sensing voltages, e.g., read voltages, to a selected word line while providing a number of voltages, e.g., read pass voltages, to the word lines coupled to the unselected memory cells of the string sufficient to place the unselected memory cells in a conducting state independent of the Vt of the unselected memory cells. The bit line corresponding to the selected memory cell being read and/or verified can be sensed to determine whether or not the selected memory cell conducts in response to the particular sensing voltage applied to the selected word line.

For example, the program state of a selected memory cell can be determined by the word line voltage at which the bit line current reaches a particular reference current associated with a particular program state. In contrast, to determine the Vt of a selected memory cell, e.g., memory cell 225-1, the corresponding word line, e.g., word line 221-1, can have a range of sensing voltages applied so that the word line is stepped, e.g., in small voltage difference increments, from a low voltage, e.g., 0 volts (V) to a relatively high voltage, e.g., 6 V. For example, the range of 0-6 V can be covered in 120 steps that each increases by 50 millivolts (mV). The voltage at which the sense output at the corresponding bit line, e.g., bit line 222-1, changes from "0" to "1", e.g., discharges, corresponds to the Vt of the selected memory cell.

In one or more embodiments of the present disclosure, in particular for a selected MLC, it can be useful to compare the determined Vt to an intended program state for that memory cell. As such, as described further with regard to FIG. 3, a number of buffers 235-1, . . . , 235-M each can be coupled to a respective local bit line 222-1, . . . , 222-M that serves as a sense line. Each buffer can include instructions and/or memory, e.g., stored on the die in a SRAM and/or another memory device, to enable Vt analysis as described herein.

Figure 3:
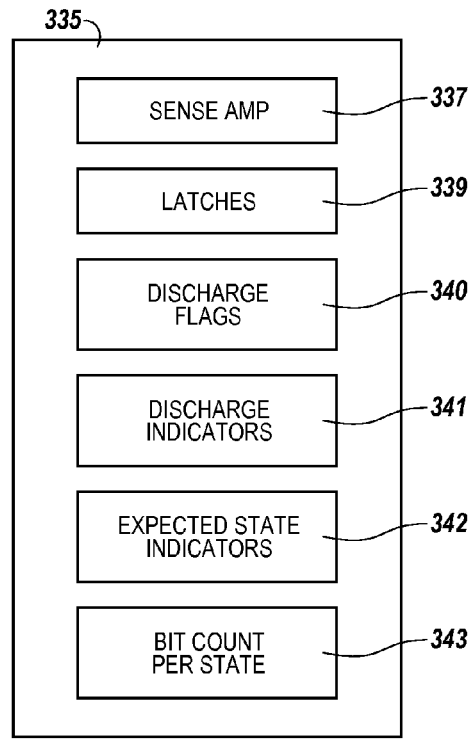
FIG. 3 is a functional block diagram of a buffer associated with performing Vt analysis in accordance with one or more embodiments of the present disclosure.

FIG. 3 is a functional block diagram of a buffer 335, e.g., corresponding to buffer 235-1 shown in FIG. 2, associated with performing Vt analysis in accordance with one or more embodiments of the present disclosure. A state of a memory cell can be determined by sensing the stored charge on the charge storage structure, e.g., the floating date, of the memory cell. However, a number of mechanisms, for example, read disturb, program disturb, erasure, and/or charge loss, e.g., charge leakage, can cause the stored charge of the memory cell to change. As a result of the change in the stored charge, an error may occur when the state of the memory cell is sensed. For example, the memory cell may be sensed to be in a state other than the target state (e.g., a state different than the state to which the memory cell was intended to be programmed) when a preprogrammed reference voltage is applied thereto. As described herein, such errors can be corrected by error correction code (ECC) schemes such as, for example, a low-density parity-check (LDPC) ECC scheme, which may utilize soft data associated with the data state of the memory cell to correct the error. Reduction of such errors, and correction thereof, can result from adjustment of a Vt for a particular memory cell based upon determination of a number of Vts more appropriate for sensing the number of program states of a selected memory cell. For example, an ECC engine can use the Vt information to tune the soft data and can utilize internal ECC parameters to optimize for given read situations.

In some examples, the soft data can be obtained from application of a soft data strobe that includes a range of sensing voltages that overlap, e.g., are substantially centered around, a preprogrammed reference voltage so that the word line corresponding to the memory cell is stepped, e.g., in small voltage difference increments, from a voltage lower than the preprogrammed reference voltage to a voltage higher than the preprogrammed reference voltage.

In some examples, a total range of 0-6 V can be covered in 120 steps that each increases by 50 mV. Such ranges of sensing voltages can be applied to an appropriate word line through execution of instructions, e.g., by the control circuitry 115 illustrated in FIG. 1, stored on the same die, e.g., the memory device 112-1 illustrated in FIG. 1, as the array, e.g., the array 114 illustrated in FIG. 1. For example, a number of sensing voltage ranges can be stored in a number of SRAM on the die, e.g., the SRAM 117 illustrated in FIG. 1, for automated application of the one or more ranges of sensing voltages via the control circuitry 115 to selected word lines of the array 114, e.g., when instructed to do so via the controller 108.

An example of the sense circuitry 116 illustrated in FIG. 1 is described further below in association with the buffers shown in FIG. 2 at 235-1, . . . , 235-M and/or the buffer 335 shown in FIG. 3. For instance, in a number of embodiments, the buffer 335 can include a sense amplifier 337 (sense amp) and a number of other components, which can be used to perform logical operations on the die, e.g., on data associated with a corresponding sense line, e.g., a local bit line. As such, data storage, collection, update, exchange, and/or comparison functions can be performed by executing instructions stored in the buffer 335 rather than and/or in addition to being performed by processing resources external to the buffer 335, e.g., by a number of processors associated with a controller 108, a host 102, and/or other processing circuitry located elsewhere.

The sense amp 337 in the buffer 335 can be coupled to at least one corresponding local bit line corresponding to a particular column of memory cells. The sense amp 337 can be operated to determine a program state, e.g., a logic data value, stored in a selected memory cell. Embodiments are not limited to a given sense amp architecture or type. For instance, sense circuitry in accordance with a number of embodiments described herein can include current-mode sense amps and/or single-ended sense amps, e.g., sense amps coupled to one sense line, among others. As described herein, a sense amp can amplify a signal associated with conduction caused by discharge of a selected memory cell, e.g., sensing a voltage and/or current change on a bit line coupled to a selected memory cell in order to determine the program state and/or the Vt of the selected memory cell by sensing when the selected memory cell begins to conduct. In one or more embodiments, the sense amp 337 also can be used as an amplifier to sense conduction of selected memory cells during a standard read operation.

The buffer 335 can include a number of latches 339. The latches 339 can operate in association with, for example, address circuitry to latch address signals provided over an I/O bus, e.g., a data bus, through I/O circuitry. Address signals can be received and decoded by, for example, a row decoder and a column decoder to access an array of memory cells, e.g., as shown at 114 in FIG. 1 and/or at 220 in FIG. 2. Data can be read from the array by sensing voltage and/or current changes on the sense lines using the sense circuitry 116, e.g., including the sense amp 337. The sense circuitry 116 can read and latch a page, e.g., a row, of data from the array in a particular latch.

Figure 6:
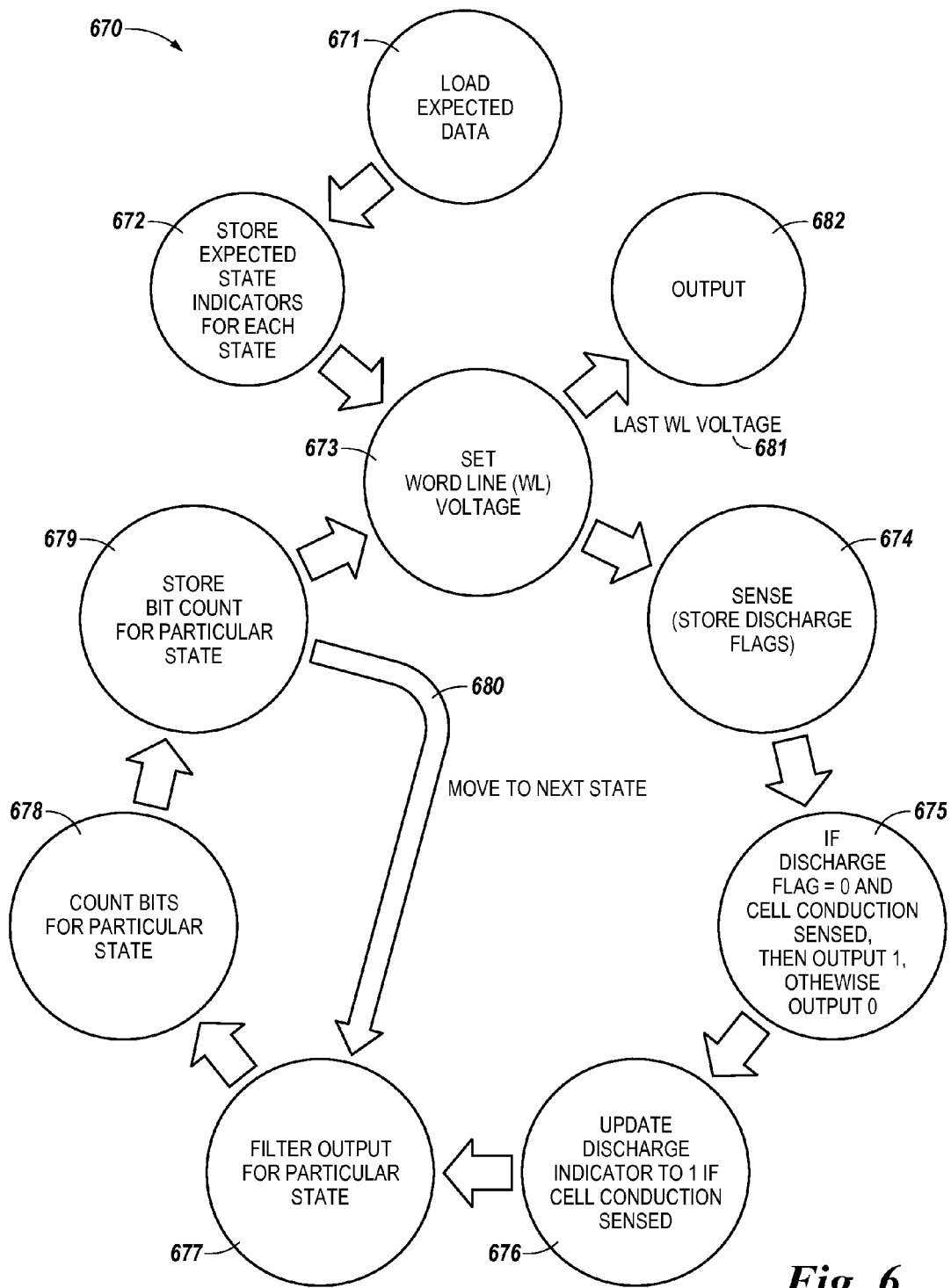
FIG. 6 is a functional block diagram illustrating a process for Vt analysis in accordance with one or more embodiments of the present disclosure.

The buffer 335 can include instructions and/or memory for collection, update, exchange, and/or comparison of discharge flags 340 and/or discharge indicators 341, as described further with regard to FIG. 6. The discharge flags 340 and/or discharge indicators 341 can be determined for each selected memory cell by the sense amp 337 sensing at which particular voltage of the applied range of sensing voltages the selected memory cell begins to conduct.

A selected memory cell that discharges at a particular voltage in the range of sensing voltages also can be expected to discharge at higher sensing voltages. For example, a discharge flag for each selected memory cell can be a flag assigned to the memory cell, e.g., "0" for a memory cell determined not to have discharged at the current sensing voltage and/or any lower sensing voltage and "1" for a memory cell having been determined to discharge at the current sensing voltage and/or any lower sensing voltage. As such, for a memory cell not having discharged at lower voltages in the range of applied sensing voltages, e.g., having a discharge flag value of 0, the sense amp 337 can output a discharge flag value of 1 at a voltage, e.g., a lowermost voltage, at which the selected memory cell discharges, otherwise output a discharge flag value of 0 for voltages at which no discharge is sensed. Memory and/or a discharge flag for the selected memory cell can be updated to a value of 1 in response to output from the sense amp 337 indicating discharge thereof at the particular sensing voltage. A discharge flag value for each selected memory cell can be stored as discharge flags 340 in the buffer 335.

Figure 4:
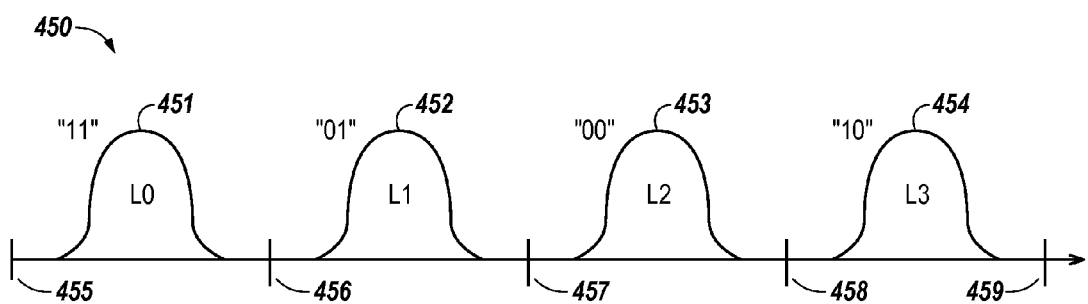
FIG. 4 is a diagram illustrating a number of Vt distributions corresponding to program states associated with programmed memory cells in accordance with one or more embodiments of the present disclosure.

Analysis of such discharge flags, as stored in the discharge flags 340, may not be adequate for determination of appropriate Vts for a plurality of program states to be used for a plurality of memory cells, e.g., as shown in FIG. 4. As such, as described further with regard to FIG. 6, output of discharge indicators 341 can be updated to force a discharge flag value of 1 to 0 for a discharge indicator value for selected memory cells previously sensed as being discharged. In some examples, the discharge indicators 341 can be updated to force the discharge indicators to 0 after sensing of each program state from a lowermost Vt to an uppermost Vt of selected memory cells has been individually completed. In some examples, the output of the discharge indicators 341 can be updated to force the discharge flag value to 0 for discharge indicator values for each previously selected memory cell sensed as being discharged before a higher sensing voltage is applied, e.g., to indicate a lowermost voltage when each memory cell begins to conduct in the range of stored sensing voltages. In one or more embodiments, however, updating a discharge indicator value, as just described, does not alter a previously assigned value of a discharge flag for a memory cell, e.g., as stored as discharge flags 340 in the buffer 335. A discharge indicator value for each selected memory cell can be stored as discharge indicators 341 in the buffer 335.

In one or more embodiments, preprogramming memory cells and storing the expected state of the memory cell can assist in analysis of the Vt of the memory cell. For example, the buffer 335 can include expected state indicators 342 that are stored as a result of input of expected, e.g., predefined, data for a number of selected memory cells. The predefined data can be input, e.g., loaded, to the selected memory cells such that each of the selected memory cells can be expected to be programmed to a particular program state. As such, the expected program state for each preprogrammed selected memory cell can be stored as expected state indicators 342.

In one or more embodiments, SLCs can be single-bit, e.g., two-state, memory cells. That is, the memory cells can be programmed to one of two program states, e.g., L0 and L1. In operation, memory cells can be programmed such that they are programmed to a program state corresponding to either L0 or L1, as determined by application of an appropriate Vt level. For example, expected program state L0 for a memory cell can be represented in the expected state indicators 342 by a stored data value such as binary "1". Expected program state L1 for a memory cell can be represented in the expected state indicators 342 by a stored data value such as binary "0". However, embodiments are not limited to these data assignments, e.g., program state L0 can represent binary "0" and program state L1 can represent binary "1".

MLCs can be programmed to one of more than two data states representing multiple bits. For example, in a four-state MLC, program state L0 for a memory cell can be represented in the expected state indicators 342 by a stored data value such as binary "11", program state L1 can be represented by a stored data value such as binary "01", program state L2 can be represented by a stored data value such as binary "00", and program state L3 can be represented by a stored data value such as binary "10". In this example, the memory cells are 2-bit memory cells with each memory cell being programmable to one of four data states (e.g., L0 to L3) each indicating a different 2-bit stored bit pattern (e.g., 11, 01, 00, and 10). In a number of embodiments, each of the bits in the 2-bit stored bit pattern corresponds to a different page of data. For instance, the right-most bit, e.g., the digital "1" in "01", can contribute to a first page of data (e.g., a lower page of data) and the left-most bit, e.g., the digital "0" in "01" can contribute to a second page of data (e.g., an upper page of data). As such, a page of memory cells can store two pages of data, in this example. However, embodiments are not limited to MLCs storing two bits of data. For instance, a number of embodiments can include memory cells configured to store more or fewer than two bits of data and/or a fractional number of bits of data. Also, embodiments are not limited to the particular values assigned to the data states L0 to L3 for storage in the expected state indicators 342.

The buffer 335 can include representation of a bit count per state 343. In one or more embodiments, the bit count per state 343 can be determined by execution of instructions to collect a Vt distribution for selected pages as follows. Collection of the Vt distribution can include setting an appropriate word line voltage, e.g., from a range of sensing voltages, and sensing selected cells, e.g., all cells, on the selected page. In one or more embodiments, the sense data, e.g., detected by the sense amp 337, can be compared to a discharge flag, e.g., in the discharge indicators 340, that indicates whether a selected memory cell has already transitioned by discharge from a "1" to a "0". As such, the discharge flag indicates whether the Vt has already been found.

When memory cells on the page that have discharged at the current word line voltage have been identified, which indicates the Vt for those memory cells, the number of memory cells that have discharged at the current word line voltage are counted as bits and stored as a bit count for that word line voltage. A comparison to the expected state indicators 342 can be made to decide in which program state each of those bits was intended to be and a bit count per state 343 can be determined, e.g., as represented in a distribution, embodiments of which are illustrated in FIG. 4 and FIGS. 5A-C.

To determine the bit count per state 343, instructions can be executed to apply the expected data that was loaded to the expected state indicators 342. For word line voltages above the first voltage, e.g., in the range of sensing voltages, the memory cells that have discharged at lower voltages applied to the word line can be filtered out, e.g., by reference to the discharge flags, to enable a bit counting function to count the number of bits for that program state at the current word line voltage. The bit count per state 343 can store the bit count value, e.g., in a SRAM on the die, to represent the number of bit counts at a particular program state and a particular word line voltage. In one or more embodiments, the instructions can be executed to loop back and filter for the next program state, count the bits, and store the bit count per state 343. Such executions can be repeated until an upper number of, e.g., all, program states have been accounted for. The data stored as bit count per state 343 can represent the number of bits from all program states at the current word line voltage, e.g., for all memory cells on the word line or page.

The instructions can be executed to increment the word line voltage by a specified step size, e.g., approximately equal increments in a range of 50-100 mV, and continue the just described process until reaching an upper voltage, e.g., an uppermost, of the sensing voltage range and/or of a specified Vt range. In one or more embodiments, when application of the range of sensing voltages to the word line is complete, the bit count per state 343, e.g., the SRAM on the die, can determine and/or store a distribution, e.g., a histogram, of the bit counts for the particular page. In one or more embodiments, the distribution, e.g., the histogram, can be read out by and/or exported to the controller 108 illustrated in FIG. 1, e.g., for further Vt analysis.

FIG. 4 is a diagram 450 illustrating a number of Vt distributions corresponding to program states associated with programmed memory cells in accordance with one or more embodiments of the present disclosure. To find the Vt of a particular memory cell, the word line can be stepped from a lower, e.g., lowermost, voltage to a higher, e.g., uppermost, voltage, sensing the memory cell at every step. The point at which the sense output changes, e.g., from a "1" to a "0", is the Vt of that memory cell. To analyze Vts, it can be useful to compare the sensed Vts of a number of memory cells throughout a range of sensing voltages to the particular program state in which each of the memory cells was intended to be, e.g., 11, 01, 00, and 10 in the case of the four-state MLC illustrated in FIG. 4. The memory cells associated with FIG. 4 can be memory cells such as memory cells 225-1, . . . , 225-N described herein with regard to FIG. 2. The memory cells associated with FIG. 4 are two-bit, e.g., four-state, MLCs. However, embodiments of the present disclosure are not limited to this example.

In a sensing operation performed on a selected memory cell in a NAND string, the unselected memory cells of the string are biased so as to be in a conducting state. In such a sensing operation, the program state of the selected memory cell can be determined based on the current and/or voltage sensed on the bit line corresponding to the string in response to a particular sensing voltage applied to the corresponding word line that matches or exceeds the Vt for the selected memory cell. For instance, the program state of the selected memory cell can be determined based on whether the bit line current changes by a particular amount or reaches a particular level in a given time period.

The Vt distributions 451, 452, 453, and 454 of FIG. 4 correspond to a number of memory cells each programmed to one of four program states, e.g., e.g., 11, 01, 00, and 10 corresponding to L0, L1, L2, and L3. In one or more embodiments, the different program states of L0 and L1 can, for example, be combined to be considered as a lower level and the different program states of L2 and L3 can be combined to be considered as an upper level. Alternatively, each of L0, L1, L2, and L3 can be considered as a separate level for Vt analysis.

As shown in FIG. 4, Vt distribution 451 corresponds to a number of memory cells that are programmed to a first program state, e.g., L0. In at least some embodiments, programming a memory cell to the first program state may simply include allowing a memory cell to remain in an erased state. That is, the first program state may actually be the erased state for both the upper page and the lower page. Vt distribution 452 can correspond to a number of memory cells that are programmed from an erased state, which could be the same as the first program state L0, to a second program state, e.g., L1. A first preprogrammed reference voltage 456, e.g., which can be higher than a ground state voltage 455, can be applied thereto through the corresponding word line in an attempt to verify, e.g., sense or read, that the program state of the selected memory cell does not remain at L0, e.g., is at least at L1.

However, Vt tails can, for example, extend from the upper end of the L0 distribution shown at 451 and the lower end of the 452 distribution shown at 452, e.g., due to broadening of a voltage level range stored by at least some memory cells for each program state resulting from erasing a memory cell prior to being reprogrammed, among other causes. One or both of such Vt tails can traverse, e.g., extend across, the first preprogrammed reference voltage 456, thereby causing an error when attempting to verify, e.g., sense or read, the program state of a memory cell having a Vt in such a tail. Similar errors can result from lower and/or upper tails of the Vt distributions shown for L1 at 452, L2 at 453, and/or L3 at 454 relative to the second preprogrammed reference voltage 457, the third preprogrammed reference voltage 458, and/or the fourth preprogrammed reference voltage 459. The positioning of the preprogrammed reference voltages 456, 457, 458, and 459 are shown by way of example for clarity and not by way of limitation. Alternatively or in addition, voltage ranges in the intervals between indicators 455, 456, 457, 458, and 459 can represent the programmed voltage ranges defining the expected state indicators, e.g., L0, L1, L2, and L3. Hence, analysis of the Vt distributions relative to the preprogrammed reference voltages and/or the expected state indicators, e.g., as shown at indicator 342 in FIG. 3, can assist in analysis of the Vts, e.g., collection, determination, correction, etc., of Vts for memory cells, and/or to determine a program state of memory cells, as described herein.

FIGS. 5A-5C illustrate data 560 stored in memory representative of memory cell discharge at a range of sensing voltages in accordance with one or more embodiments of the present disclosure. The data 560 illustrated in FIGS. 5A-5C can be stored in memory of the number of buffers 235-1, . . . , 235-M each coupled to a respective local bit line 222-1, . . . , 222-M to serve as a sense line, e.g., as described with regard to FIG. 2. For example, the data 560 can be processed by instructions executed to determine the bit count per state 343, e.g., as described with regard to FIG. 3. The resultant bit count per state information, e.g., as illustrated in FIGS. 5A-5C, can be stored in one or more SRAM coupled to each buffer on the die. In one or more embodiments, the bit count per state information can be stored in a number of histogram formats, in a format convertible to a number of histograms, and/or a tabular format, among other suitable data structures.

The data 560 represented in FIG. 5A shows headers at the top of the data structure to denote the type of data contained in each column. For example, the data 560 in the data structure can include a column to document the block 561 of memory cells to which sensing voltages are applied. Such a block is schematically represented in FIG. 2. As shown in FIG. 5A, the data structure also can include a column to document the page 562 of memory cells to which sensing voltages are applied through a corresponding word line. In some examples, there can be 256 pages per block and 4320 bytes, e.g., 34,560 bits, of information per page.

As shown in FIG. 5A, the data structure also can include a column to document the sensing voltage, represented by digital to analog conversion (DAC) 563, applied to each of the selected memory cells of the page, e.g., page 255 of block 456. The value presented in the DAC 563 column is a digital or binary value used to represent a particular sensing voltage. For example, 0V, or another designated lowest voltage to be applied to the word line, can be represented by a DAC value of 0, 0.3V can be represented by a DAC value of 1, 0.6V can be represented by a DAC value of 2, 0.9V can be represented by a DAC value of 3, . . . , 4.7V can be represented by a DAC value of 88, etc., up through the highest sensing voltage to be applied being represented by the highest DAC value. DAC values are commonly represented as consecutive integers. Embodiments of the present disclosure are not limited to these examples.

In the data 560 illustrated in FIGS. 5A-5C, the sensing voltage steps are represented by 125 consecutive DAC values, e.g., DAC values 0-124 stepping from, for instance, 0-6V. In one or more embodiments, each DAC consecutive value can represent incremental changes of the sensing voltage of approximately equal step sizes, e.g., approximately equal increments in a range of 50-100 mV. In one or more embodiments, each DAC consecutive value can represent DAC values substantially centered around one or more of a number of preprogrammed reference voltages so that the selected memory cell is stepped, e.g., in small voltage difference increments, from a voltage lower than a particular one of the number of preprogrammed reference voltages to a voltage higher than the particular one of the number of preprogrammed reference voltages. In some examples, consecutive DAC values can represent a notable gap where no sensing voltages are applied between the values centered around, for example, one preprogrammed reference voltage and an adjacent, e.g., a next higher, preprogrammed reference voltage. Such soft data may be usable for correction of detected Vt errors by ECC schemes such as, for example, a LDPC scheme, which may utilize the soft data associated with the expected program state of the memory cell to correct the error.

In one or more embodiments, as shown in FIG. 5A, the data structure also can include separate columns to document each of the number of program states to which selected memory cells can be programmed. The program states to which the selected memory cells can be programmed can, for example, correspond to the different program states represented in the expected state indicators 342 shown in FIG. 3 and/or the program states L0, L1, L2, and L3 shown in FIG. 4, depending on the bit-size of the memory cells. Accordingly, for two-bit, four-state memory cells, the data structure can include a first column 551 for the L0 program state, a second column 552 for the L1 program state, a third column 553 for the L2 program state, and a fourth column 554 for the L3 program state.

For each selected memory cell to which a sensing voltage is applied, a determination can be made as to whether memory cell conduction is sensed, e.g., by the sense amp 337 shown in FIG. 3. If such conduction is sensed, e.g., by the sense line current reaching at least a particular reference current, a discharge indicator for that memory cell can be updated to record such discharge as a bit, e.g., by changing from 0 to 1. By referring to the expected state indicator 342 stored as a result of loading the expected data, the expected program state for the selected memory cell can be determined. As such, the bit that records the discharge can be added to the appropriate column.

For example, if a sensing voltage with a DAC value of 0 applied to a selected memory cell results in memory cell conduction and the expected program state for the selected memory cell is L0, the bit can be added to the L0 column. Applying the same sensing voltage to other selected memory cells coupled to that word line, e.g., page 255, can increase the counts of bits in the appropriate columns depending upon the expected program state for each of the selected memory cells. For example, many of the memory cells on page 255 may have an L3 expected state indicator resulting from loading the expected data, although none of them conduct current at the DAC value of 0, as shown in column 554, whereas many memory cells with an L0 expected state indicator conduct current at the DAC value of 0, as shown in column 551, which results in an elevated bit count at that DAC value.

Increasing the DAC value, e.g., the sensing voltage, can result in progressively smaller numbers of memory cells with an L0 expected state indicator beginning to conduct current for the first time, e.g., not having conducted at a lower DAC value. However, there can be a notable tail extending from the large bit count at the DAC value of 0, with some of the memory cells not conducting until reaching the 20-27 DAC value range, which is close to a DAC value of 31 where some memory cells with an L1 expected state indicator begin to conduct. Moreover, the DAC values at which memory cells having different expected state indicators begin to conduct can overlap due to upwardly and/or downwardly extending tails. For example, although DAC values of 38-52 shown on FIGS. 5A-5B are in the low-to-mid range of the sensing voltages where memory cells with an L1 expected state indicator begin to conduct, some of the memory cells with memory cells with an L2 expected state indicator also begin to conduct in this range. Similarly, a range of DAC values at which memory cells with an L2 expected state indicator begin to conduct can overlap with a range of DAC values at which memory cells with an L3 expected state indicator begin to conduct, e.g., see DAC value 92 on FIG. 5B. In one or more embodiments, the bit counts for the different program states, e.g., as illustrated in FIGS. 5A-5C and/or as stored in the bit count per state 343 in the buffer 335 shown in FIG. 3, can be represented as a histogram, e.g., similar to that shown in FIG. 4.

Accordingly, one or more methods for Vt analysis, as described herein, can include storing expected state indicators, e.g., as shown at indicator 342 in FIG. 3, corresponding to a group of memory cells, applying a first sensing voltage to a selected access line to which the group of memory cells is coupled, sensing whether at least one of the memory cells of the group conducts responsive to the first sensing voltage, determining whether a discharge indicator, e.g., as shown at indicator 341 in FIG. 3, for the at least one of the memory cells has changed responsive to the first sensing voltage, and determining that the first sensing voltage is the Vt for a particular program state of the at least one of the memory cells. For example, the stored expected state indicators can be compared with a stored discharge indicator for the at least one of the memory cells to determine that the first sensing voltage is the Vt for the particular program state of the at least one of the memory cells.

In one or more embodiments, the method can include sensing, using a first sensing voltage, a group of memory cells each programmed to one of a number of target states and coupled to the selected access line, where the first sensing voltage is one of a series of sensing voltages to be used in determining Vts corresponding to the group of memory cells. For example, the first sensing voltage can be one of a stored series of sensing voltages to be used subsequently as sensing voltages to sense the group of memory cells. In some examples, sensing the group of memory cells can include sensing a page, e.g., a page corresponding to a complete access line or word line, of memory cells.

As described herein, in one or more embodiments, the method can include determining which of the memory cells conduct responsive to the first sensing voltage, e.g., by automated consecutive selection of the memory cells to which a sensing voltage is applied. The automated consecutive selection of the memory cells can be performed, for example, by the control circuitry, e.g., as shown at indicator 115 in FIG. 1. A discharge flag, e.g., as shown at indicator 340 in FIG. 3 and, for example, having a value of 0 or 1, can be determined for each of the memory cells that indicates whether each of the memory cells conducts responsive to the first sensing voltage, where the value of the discharge flag does not change at sensing voltages higher than the first sensing voltage at which conduction is sensed. To determine whether a discharge indicator has changed responsive to the first sensing voltage for the at least one of the memory cells can include referring to the discharge flag for the at least one of the memory cells, which can indicate that the first sensing voltage is a lowermost sensing voltage, e.g., of a series of sensing voltages, that causes the at least one of the memory cells to conduct, e.g., by the discharge flag having a value of 0 for the preceding sensing voltage and a current sensing voltage resulting in conduction by the at least one of the memory cells.

In one or more embodiments, a method for Vt analysis, as described herein, can include storing expected state indicators in a number of memory devices on a die, e.g., in the buffer 335 at indicator 342 in FIG. 3, to indicate an expected program state, e.g., expected to be read at a particular sensing voltage, of each of a number of programmed memory cells, applying a range of sensing voltages to a selected access line coupled to an array of memory cells on the same die, and sensing a discharge at least at some of the range of sensing voltages when a number of memory cells each begins to conduct. As described herein, in one or more embodiments, the method can include storing bit counts in a number of memory devices on the die, e.g., as shown in FIGS. 5A-5C, to indicate a number of memory cells that discharge at least at some of the range of sensing voltages. The method can include analyzing the stored state indicators in comparison to the stored bit counts to determine an appropriate sensing Vt between at least a first program state and a second program state, e.g., as shown by way of example in FIG. 4 at indicator 456 between program state 451 and program state 452.

In some examples, the number of memory cells on the die can be programmed such that each of the number of programmed memory cells can be expected to be read at least at the first program state or the second program state, e.g., for SLCs or for MLCs programmed at only an upper level or a lower level. In some examples, the number of memory cells on the die can be programmed such that each of the number of programmed memory cells can be expected to be read at a first program state or a second program state in a lower level and/or at a third program state or a fourth program state in an upper level. In some examples, as described herein, programming the number of memory cells can include programming a number of MLCs in a NAND array.

As described herein, in one or more embodiments, the method can include storing the bit counts to indicate a number of memory cells in the first program state and the second program state in the lower level and/or a number of memory cells in the third program state and the fourth program state in the upper level that discharge at least at some of the range of sensing voltages, e.g., as shown in FIG. 4 and/or FIGS. 5A-5C. In one or more embodiments, the stored state indicators can be analyzed in comparison to the stored bit counts to determine a number of appropriate sensing Vts between at least one of the first program state and the second program state, the second program state and the third program state, and/or the third program state and the fourth program state, e.g., as shown by way of example in FIG. 4 at indicator 456 between program state 451 and program state 452, at indicator 457 between program state 452 and program state 453, and/or at indicator 458 between program state 453 and program state 454.

FIG. 6 is a functional block diagram illustrating a process 670 for Vt analysis in accordance with one or more embodiments of the present disclosure. In one or more embodiments, the process 670 can include a load, e.g., programming, of the expected, e.g., predefined, data 671 to a number of selected memory cells. As described herein, the selected memory cells can be coupled to a number of word lines, e.g., pages, in a block of a NAND architecture, a NOR architecture, or some other memory array architecture. Expected state indicators for each state can be stored 672 for each programmed memory cell, as described herein, for the loaded expected, e.g., predefined, data 671. For example, an expected state indicator can be stored for each programmed memory cell to indicate whether the memory cell was intended to be programmed to the L0, L1, L2, or L3 program state.

In one or more embodiments, as described herein, a set word line voltage 673, e.g., from a range of sensing voltages, can be applied to a word line corresponding to memory cells to be selected. By application of the set word line voltage to a selected memory cell, it can be sensed 674, as described herein, whether the memory cell conducts at that particular voltage. At a lower, e.g., lowermost, voltage at which the selected memory cell conducts, a signal can be output, e.g., by sense amp 337, to change a discharge flag assigned to the selected memory cell, e.g., from "0" for a memory cell determined not to have discharged at a lower sensing voltage to "1" for a memory cell having been determined to discharge at the current sensing voltage. Such a discharge flag indicative of the lowermost word line voltage at which the selected memory cell conducts can be stored, e.g., in the buffer 335 at 340 in FIG. 3. This discharge flag also can indicate that the selected memory cell conducts at word line voltages higher than the lowermost word line voltage at which the selected memory cell conducts. The stored discharge flag value, e.g., the digital or binary value of 1, indicative of the lowermost and higher word line voltages at which the selected memory cell conducts is stored for reference during the process 670 for Vt analysis at least until the last, e.g., highest, word line voltage has been applied.

If the stored discharge flag for a selected memory cell has a value of 0, indicating that the memory cell has not begun to conduct at a lower applied word line voltage, and memory cell conduction is sensed at a currently applied word line voltage, a value of 1 can be output, as shown at indicator 675. If the stored discharge flag for the selected memory cell does not have a value of 0, that is, the discharge flag has a value of 1 indicating that the memory cell has begun to conduct at a lower applied word line voltage, a value of 0 can be output, as also shown at indicator 675.

When the value of 1 is output, indicating that the selected memory cell has just begun to conduct at the currently applied word line voltage and not at lower word line voltages, a discharge indicator, as opposed to the discharge flag, can be updated to a value of 1, as shown at indicator 676. In contrast, when the value of 0 is output, indicating that the selected memory cell had begun to conduct at a lower applied word line voltage, a discharge indicator can be updated to a value of 0, or remain at 0 if previously updated to that value, as also shown at indicator 676. As such, a discharge indicator only has a value of 1 for an associated memory cell to indicate the lower, e.g., lowermost, word line voltage at which the associated memory cell begins to conduct.

For example, referring to FIG. 5A, at the DAC 563 value of 0, 17,747 memory cells with an L0 expected state indicator, as shown at indicator 551, began to conduct. At the DAC value of 1, 174 more memory cells with an L0 expected state indicator began to conduct, although the 17,747 memory cells with an L0 expected state indicator that began to conduct at the DAC value of 0 would still be expected to conduct at the DAC value of 1. However, because the discharge indicator would only have a value of 1 for the memory cells that began to conduct at the DAC value of 1, and the memory cells that began to conduct at a lower DAC value, e.g., the DAC value of 0, would have discharge indicators updated to 0, only the 174 newly conducting memory cells would register a bit for the DAC value of 1 at the L0 expected state indicator.

When a selected number of, e.g., all, memory cells have been sensed and those that begin to conduct, e.g., have a Vt, at the current word line voltage have been identified with a discharge indicator, output can be filtered for a particular state, as shown at indicator 677 in FIG. 6. In one or more embodiments, the discharge indicators, indicating newly conducting memory cells sensed at the current word line voltage, can each be correlated with an expected state indicator for that particular memory cell, e.g., as shown at indicator 342 in FIG. 3, so as to form a data structure, e.g., distribution, for the data, e.g., as illustrated in FIGS. 5A-5C.

For example, the output can first be filtered to document the discharge indicators having a value of 1, e.g., bits, for the L0 expected state indicator, e.g., program state.

The bits for the particular state can then be counted, as shown at indicator 678 in FIG. 6, for the current word line voltage. When the sensed data for the first program state has been filtered, a bit counting operation can be performed, e.g., by the bit count per state 343 executing instructions stored therein or elsewhere in the buffer 335, to count the number of bits for the first program state at the current word line voltage. The bit count for the particular program state can then be stored, as shown at indicator 679 in FIG. 6. For example, bit counts for each program state for each word line voltage can be stored on a SRAM on the die, e.g., coupled to the bit count per state 343 in the buffer 335 shown in FIG. 3.

The process 670 can loop back 680 and filter for the next program state, as shown at indicator 677 in FIG. 6, and count the bits, e.g., for the L1 expected state indicator, and store the bit count. The process 670 can repeat this loop until a selected number, e.g., all, of program states have been filtered and have had bits counted and stored. The stored bit counts can represent the number of bits from all program states at the current word line voltage, e.g., at any DAC value in column 563 of FIGS. 5A-5C.

The process 670 can then increment the word line voltage, as shown at indicator 673 in FIG. 6, according to a specified step size, as described herein, and continue incrementing the word line voltage until the voltage has reached a last, e.g., uppermost, word line voltage of a specified sensing voltage range, as shown at indicator 681.

During the counting, storing, and/or after completion, the bit count per state information can be stored in a number of histogram formats, in a format convertible to a number of histograms, and/or a tabular format, e.g., consistent with those shown in FIG. 4 and/or FIGS. 5A-5C, among other suitable data structures. As described, the stored bit count per state information can represent results from applying a range of sensing voltages, e.g., a series of set word line voltages, to a particular word line corresponding to a number of memory cells of an array, e.g., corresponding to a single page in the array. As such, in one or more embodiments, the bit count per state information can be stored, e.g., in SRAM, for a single page after application of the last, e.g., uppermost, word line voltage of the specified sensing voltage range.

The present disclosure describes providing visibility into Vt distributions to a manufacturer- and/or seller-associated tester and/or an in-service tester, e.g., provided by an automated testing program and/or by a human operator, among other possibilities. In one or more embodiments, the methods and apparatuses presented herein enable collection and storage of the Vt distributions by, for example, NAND page, with the Vt distributions being contained to the NAND die itself.

After data storage, collection, update, processing, and/or comparison functions have been performed by executing instructions stored in the buffers 235-1, . . . , 235-M shown in FIG. 2 and/or the buffer 335 shown in FIG. 3, the bit count per state information can be output for further Vt analysis, as shown at indicator 682 in FIG. 6. For example, the bit count per state information for the single page can be output, e.g., directly, from one or more SRAM, e.g., as shown at indicator 117 in FIG. 1, to a controller, e.g., as shown at indicator 108 in FIG. 1, and/or accessed by the controller from the one or more SRAM. In one or more embodiments, the information stored on the one or more SRAM can be erased after output to and/or access by the controller to provide memory space for further Vt analysis. In one or more embodiments, the controller can be included on a separate physical device that is communicatively coupled to the physical device (e.g., the die) that includes one or more of the memory devices 112-1, . . . , 112-N.

In one or more embodiments, analysis 110 circuitry and/or programming for analysis and/or implementation of firmware analytics can be included on the controller 108 and/or the host 102 for the further Vt analysis and/or related analyses and/or functions, e.g., Vt error correction, etc. In one or more embodiments, as described herein, soft data may be usable for correction of detected Vt errors by ECC schemes such as, for example, a LDPC scheme, which may utilize the soft data in association with the expected program state, e.g., the expected state indicators 342 shown in FIG. 3, of each of the memory cells to correct the errors.

Accordingly, one or more methods for Vt analysis, as described herein, can include applying a first sensing voltage in a range of sensing voltages to a selected access line coupled to an array of memory cells, sensing conduction of each selected memory cell that conducts at the first sensing voltage, storing a discharge flag indicative of the first sensing voltage at which each selected memory cell conducts, applying a higher second sensing voltage in the range of sensing voltages to determine which of the selected memory cells conduct at the second sensing voltage, and outputting a discharge indicator of a value indicative of a lowermost sensing voltage at which at least one selected memory cell begins to conduct.

As described herein, in one or more embodiments, the method can include outputting the discharge indicator of the value indicative of the lowermost sensing voltage, e.g., the higher second sensing voltage, if the discharge flag indicates that the at least one selected memory cell did not conduct at the first sensing voltage. The discharge indicator can be forced to a value indicative of no conduction by the at least one selected memory cell if the discharge flag indicates that the at least one selected memory cell did conduct at the first sensing voltage.

In one or more embodiments, the method for Vt analysis, as described herein, can include filtering output of the discharge indicators as bits for a first program state of a plurality of program states by comparing stored expected state indicators for preprogrammed memory cells with the discharge indicator for the at least one of the selected memory cells. For example, the bits for the first program state can be counted and a bit count for the first program state can be stored in a memory device, e.g., in the buffer 335 at indicator 343 in FIG. 3, to indicate a number of memory cells that discharge at the lowermost sensing voltage at which the at least one selected memory cell begins to conduct. In addition, output of the discharge indicators can be filtered as bits for at least a second program state of the plurality of program states, the bits for the second program state can be counted and a bit count for the second program state can be stored in the memory device.

In one or more embodiments, the method can include incrementally increasing the sensing voltage applied to the selected access line to an uppermost sensing voltage in the range of sensing voltages. A bit count per state distribution, e.g., as shown in FIG. 4 and/or FIGS. 5A-5C, can be determined by the memory device, e.g., in the buffer 335 at indicator 343 in FIG. 3.

In one or more embodiments, the method can include outputting the bit count per state distribution from the memory device, e.g., a SRAM as shown at indicator 117 in FIG. 1, to a controller coupled to at least one array of memory cells, e.g., as shown at indicator 108 in FIG. 1. The controller can, for example, analyze the bit count per state distribution to determine an appropriate sensing Vt between at least a first program state and a second program state. For example, the controller can determine an error in at least one preprogrammed reference voltage and/or direct correction of the error by error correction code schemes that utilize soft data associated with a program state of a memory cell to correct the error, as described herein.

An physical interface to a host, e.g., as shown at indicators 106 and 102 in FIG. 1, respectively, can be provided to enable input regarding execution and/or customization of the Vt collection, analysis, etc. The physical host interface 106 can enable input of a command sequence with addressing to command initiation of the process, e.g., as described with regard to FIG. 6, at a specified block and/or page of an array of memory cells, as described herein. The process can be initiated and/or performed by execution of instructions stored in the control circuitry 115, sense circuitry 116, and/or the SRAM 117 shown in FIG. 1 and/or one or more of the elements 337, 339, 340, 341, 342, and/or 343 of the buffer 335 shown in FIG. 3. The physical host interface 106 can enable customization of the Vt measurement, as well as customization of execution and/or output the resulting bit count per state information, which can be stored in a number of histogram formats, in a format convertible to a number of histograms, and/or a tabular format, among other formats. The physical host interface 106 can enable input of the specified sensing voltage range, e.g., lowermost and/or uppermost set word line voltages, and/or voltage step sizes and/or gaps between such steps. In addition, the physical host interface 106 can enable output to the host 102 of the bit count per state distributions, e.g., histograms, stored in SRAM 117 on the dies and/or Vt analyses 110 performed by the controller 108. The input of the expected, e.g., predefined, data designed to yield, for example, an informative histogram can be loaded, e.g., to the expected state indicators 342 shown in FIG. 3, using common commands native to the operative computing device. In one or more embodiments, a special command can be combined with the common commands to allow for both lower and upper page data to be loaded as desired.

In one or more embodiments, an apparatus for Vt analysis, as described herein, can include an array of memory cells, e.g., as shown in FIG. 1 at indicator 114 and/or in FIG. 2 at 220, and control circuitry, e.g., as shown in FIG. 1 at indicator 115, configured to apply a range of stored sensing voltages to a selected access line coupled to the array of memory cells. In one or more embodiments, the apparatus can include sense circuitry, e.g., as shown in FIG. 1 at indicator 116, configured to sense a discharge of each of a number of memory cells, when each begins to conduct, potentially resulting from application of each voltage in the range of stored sensing voltages. For example, the sense circuitry can include a sense amp, e.g., as shown in buffer 335 at indicator 337 in FIG. 3, configured to sense conduction caused by discharge of each of a number of memory cells coupled to the selected access line potentially resulting from application of each voltage in the range of stored sensing voltages. In some examples, the sense amp 337 can be operably coupled to a selected sense line, e.g., one or more of local bit lines 222-1, . . . , 222-M shown in FIG. 2, associated with the selected access line, e.g., one of word lines 221-1, . . . , 221-N shown in FIG. 2.

In one or more embodiments, as described herein, the apparatus can be configured to store expected state indicators, e.g., in memory as shown in buffer 335 at indicator 342 in FIG. 3, to indicate the expected program state, e.g., expected to be read at a particular sensing voltage, of each of a number of preprogrammed memory cells. In one or more embodiments, as described herein, the apparatus can be configured to store a discharge flag for each of a number of memory cells, e.g., in memory as shown in buffer 335 at indicator 340 in FIG. 3, that indicates conduction starting at a lowermost voltage, when each begins to conduct, in the range of stored sensing voltages. In one or more embodiments, as described herein, the apparatus can be configured to store a discharge indicator for each of a number of memory cells, e.g., in memory as shown in buffer 335 at indicator 342 in FIG. 3, that indicates a lowermost voltage, when each begins to conduct, in the range of stored sensing voltages.

The discharge indicator can indicate a lowermost voltage by, for example, execution of instructions to force the discharge indicator to a value indicative of no conduction, e.g., a value of 0, if the discharge flag indicates, e.g., by having a value of 1, that at least one selected memory cell conducts at a lower applied sensing voltage than a currently applied sensing voltage. The apparatus, e.g., one or more memory devices as shown in buffer 335 in FIG. 3, can be configured to output the discharge indicators as bits for a first program state and/or to count and store bit counts to indicate a total number of memory cells that each begin to conduct at the lowermost voltage, e.g., as shown in FIGS. 5A-5C.

In one or more embodiments, at least the sense amp, the memory device configured to store the discharge flag, and the memory device configured to store the discharge indicator are included in the same buffer, e.g., buffer 335 shown in FIG. 3, operably coupled to the selected sense line associated with the selected access line. In one or more embodiments, at least one of the memory devices, e.g., elements 340, 341, 342, and/or 343 of the buffer 335 shown in FIG. 3, is one or more SRAM that is formed on the same die as at least one of the array of memory cells, the selected access line, the control circuitry, the sense amplifier, and/or the selected sense line. That is, for example, the array of memory cells, the control circuitry, the sense circuitry, and the at least one of the number of the memory devices can be formed on a single die.

In one or more embodiments, a controller can be operably coupled external to the die, e.g., as shown at indicators 108 and 112-1 in FIG. 1, and can be configured to analyze the stored expected state indicators in comparison to the stored bit counts to determine an appropriate sensing Vt between at least a first program state and a second program state. In some examples, the apparatus can be configured to send the stored bit counts to the controller for analysis after bit counts for a complete page of memory cells are stored. In some examples, the apparatus can be configured to send the stored bit counts to the controller for analysis after bit counts for a complete string, e.g., NAND strings 224-1, . . . , 224-M shown in FIG. 2, of memory cells are stored. In some examples, the apparatus, e.g., a memory device as shown at bit count per state 343 in the buffer 335 in FIG. 3, can be configured to form a bit count distribution and/or send the bit count distribution, e.g., as shown in FIG. 4 and/or FIGS. 5A-5C, to the controller for analysis after an uppermost voltage in the range of stored sensing voltages is applied and the resultant bit count distribution is stored.

CONCLUSION

The present disclosure includes apparatuses and methods for Vt analysis. One or more apparatuses for threshold Vt analysis include an array of memory cells, control circuitry configured to apply a range, e.g., series, of stored sensing voltages to a selected access line, e.g., word line, coupled to the array of memory cells, e.g., applied subsequent to storage of the range of stored sensing voltages. The one or more apparatuses include sense circuitry configured to sense a discharge of each of a number of memory cells, when each begins to conduct, potentially resulting from application of each voltage in the range of stored sensing voltages, where the apparatus is configured to store a discharge indicator for each of a number of memory cells that indicates a lower voltage, e.g., a lowermost voltage when each begins to conduct, in the range of stored sensing voltages.

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and methods are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method for threshold voltage analysis, comprising:
    storing expected state indicators corresponding to a group of memory cells;
    applying a first sensing voltage to a selected access line to which the group of memory cells is coupled;
    sensing whether at least one of the memory cells of the group conducts responsive to the first sensing voltage;
    determining a discharge flag value for each of the memory cells that indicates whether each of the memory cells in the group conducts responsive to the first sensing voltage, wherein the discharge flag value for each of the memory cells is stored for reference in a buffer;
    determining whether a discharge indicator for the at least one of the memory cells has changed responsive to the first sensing voltage by referring to the stored discharge flag value for the at least one of the memory cells; and
    determining that the first sensing voltage is the threshold voltage for a particular program state of the at least one of the memory cells.

2. The method of claim 1, including comparing the stored expected state indicators with a stored discharge indicator for the at least one of the memory cells to determine that the first sensing voltage is the threshold voltage for the particular program state of the at least one of the memory cells.

3. The method of claim 1, including sensing, using the first sensing voltage, the group of memory cells each programmed to one of a number of target states and coupled to the selected access line.

4. The method of claim 1, wherein the first sensing voltage is one of a series of sensing voltages to be used in determining threshold voltages corresponding to the group of memory cells.

5. The method of claim 1, wherein the first sensing voltage is one of a stored series of sensing voltages to be used subsequently as sensing voltages to sense the group of memory cells.

6. The method of claim 1, wherein sensing the group of memory cells comprises sensing a page of memory cells.

7. The method of claim 1, including determining which of the memory cells conduct responsive to the first sensing voltage.

8. The method of claim 1, wherein determining the discharge flag value includes not changing a value of the discharge flag value at sensing voltages higher than the first sensing voltage.

9. The method of claim 1, including determining that the first sensing voltage is a lowermost sensing voltage of a series of sensing voltages that causes the at least one of the memory cells to conduct.

10. A method for threshold voltage analysis, comprising:
    storing expected data values in a number of memory devices on a die to indicate an expected program state of each of a number of programmed memory cells;
    applying a range of sensing voltages to a selected access line coupled to an array of memory cells on the die;
    sensing a discharge at least at some of the range of sensing voltages when a number of memory cells each begins to conduct;
    storing bit counts in the number of memory devices on the die to indicate a number of memory cells that discharge at least at some of the range of sensing voltages; and
    analyzing the stored expected data values in comparison to the stored bit counts to determine an appropriate sensing threshold voltage between at least a first program state and a second program state.

11. The method of claim 10, including programming a number of memory cells on the die such that each of the number of programmed memory cells is expected to be read at least at the first program state or the second program state.

12. The method of claim 10, including programming a number of memory cells on the die such that each of the number of programmed memory cells is expected to be read at a first program state or a second program state in a lower level and at a third program state or a fourth program state in an upper level.

13. The method of claim 12, wherein programming the number of memory cells includes programming a number of multilevel cells (MLC) in a NAND array.

14. The method of claim 12, including:
    storing the bit counts to indicate a number of memory cells in the first program state and the second program state in the lower level and a number of memory cells in the third program state and the fourth program state in the upper level that discharge at least at some of the range of sensing voltages.

15. The method of claim 12, including:
    analyzing the stored data values in comparison to the stored bit counts to determine a number of appropriate sensing threshold voltages between at least one of the first program state and the second program state, the second program state and the third program state, and the third program state and the fourth program state.

16. A method for threshold voltage analysis, comprising:
applying a first sensing voltage in a range of sensing voltages to a selected access line coupled to an array of memory cells;
sensing conduction of each selected memory cell that conducts at the first sensing voltage;
storing a discharge flag value indicative of the first sensing voltage at which each selected memory cell conducts;
applying a higher second sensing voltage in the range of sensing voltages to determine which of the selected memory cells conduct at the second sensing voltage;
determining whether a discharge indicator for at least one of the memory cells has changed responsive to the first sensing voltage by referring to the stored discharge flag value for the at least one of the memory cells; and
outputting the discharge indicator of a value indicative of a lowermost sensing voltage at which at least one selected memory cell begins to conduct.

17. The method of claim 16, including:
outputting the discharge indicator of the value indicative of the lowermost sensing voltage if the stored discharge flag value indicates that the at least one selected memory cell did not conduct at the first sensing voltage.

18. The method of claim 17, including:
forcing the discharge indicator to a value indicative of no conduction by the at least one selected memory cell if the stored discharge flag value indicates that the at least one selected memory cell did conduct at the first sensing voltage.

19. The method of claim 16, including:
filtering output of the discharge indicators as bits for a first program state of a plurality of program states by comparing stored expected state indicators for preprogrammed memory cells with the discharge indicator for the at least one of the selected memory cells.

20. The method of claim 16, including:
counting bits for a first program state; and
storing a bit count for the first program state in a memory device to indicate a number of memory cells that discharge at the lowermost sensing voltage at which the at least one selected memory cell begins to conduct.

21. The method of claim 20, including:
filtering output of the discharge indicators as bits for at least a second program state of the plurality of program states;
counting the bits for the second program state; and
storing a bit count for the second program state in the memory device.

22. The method of claim 16, including incrementally increasing the sensing voltage applied to the selected access line to an uppermost sensing voltage in the range of sensing voltages.

23. The method of claim 22, including determining a bit count per state distribution by the memory device.

24. The method of claim 23, including outputting the bit count per state distribution from the memory device to a controller coupled to at least one array of memory cells.

25. The method of claim 16, including a controller analyzing a bit count per state distribution to determine an appropriate sensing threshold voltage between at least a first program state and a second program state.

26. The method of claim 16, including a controller determining an error in at least one preprogrammed reference voltage and directing correction of the error by error correction code schemes that utilize soft data associated with a program state of a memory cell to correct the error.

27. An apparatus, comprising:
an array of memory cells;
control circuitry configured to apply a range of stored sensing voltages to a selected access line coupled to the array of memory cells; and
sense circuitry configured to sense a discharge of each of a number of memory cells, when each begins to conduct, potentially resulting from application of each voltage in the range of stored sensing voltages;
wherein the apparatus is configured to:
store a discharge indicator for each of a number of memory cells that indicates a lowermost voltage, when each begins to conduct, in the range of stored sensing voltages,
count and store bit counts to indicate a total number of memory cells that each begin to conduct at the lowermost voltage; and
analyze stored expected data values in comparison to the stored bit counts to determine an appropriate sensing threshold voltage.

28. The apparatus of claim 27, wherein the apparatus is further configured to store the expected data values to indicate the expected program state of each of a number of preprogrammed memory cells.

29. The apparatus of claim 27, wherein the array of memory cells, the control circuitry, and the sense circuitry are formed on a die.

30. The apparatus of claim 27, wherein a controller external to the die is configured to analyze the stored expected data values in comparison to the stored bit counts to determine the appropriate sensing threshold voltage between at least a first program state and a second program state.

31. The apparatus of claim 27, wherein the apparatus is further configured to send the stored bit counts to a controller for analysis after bit counts for a page of memory cells are stored.

32. An apparatus, comprising:
an array of memory cells;
control circuitry configured to apply a range of stored sensing voltages to a selected access line coupled to the array of memory cells; and
a sense amplifier configured to sense conduction caused by discharge of each of a number of memory cells coupled to the selected access line potentially resulting from application of each voltage in the range of stored sensing voltages;
wherein the apparatus is configured to
store a discharge flag value for each of a number of memory cells that indicates conduction starting at a lowermost voltage, when each begins to conduct, in the range of stored sensing voltages; and
determine whether a discharge indicator for at least one of the memory cells has changed responsive to the range of stored sensing voltages by referring to the stored discharge flag value for the at least one of the memory cells.

33. The apparatus of claim 32, wherein the apparatus is further configured to store a discharge indicator for each of a number of memory cells that indicates a lowermost voltage, when each begins to conduct, in the range of stored sensing voltages.

34. The apparatus of claim 32, wherein:
the discharge indicator indicates a lowermost voltage by execution of instructions to force the discharge indicator to a value indicative of no conduction if the discharge flag value indicates that at least one selected memory cell conducts at a lower applied sensing voltage than a currently applied sensing voltage.

35. The apparatus of claim 32, wherein the apparatus is further configured to output discharge indicators as bits for a first program state.

36. The apparatus of claim 32, wherein the apparatus is further configured to form a bit count distribution; and send the bit count distribution to a controller for analysis after an uppermost voltage in the range of stored sensing voltages is applied and a resultant bit count distribution is stored.

37. The apparatus of claim 32, wherein the sense amplifier is operably coupled to a selected sense line associated with the selected access line.

38. The apparatus of claim 32, wherein:

at least the sense amplifier, a memory device configured to store the discharge flag value, and a memory device configured to store the discharge indicator are included in a same buffer operably coupled to the selected sense line associated with the selected access line.

39. The apparatus of claim 38, wherein:

at least one of the memory devices is a static random access memory (SRAM) that is formed on a same die as at least one of the array of memory cells, the selected access line, the control circuitry, the sense amplifier, and the selected sense line.

* * * * *